(12) United States Patent
Hussain et al.

(10) Patent No.: US 9,203,010 B2
(45) Date of Patent: Dec. 1, 2015

(54) APPARATUSES AND SYSTEMS FOR EMBEDDED THERMOELECTRIC GENERATORS

(71) Applicant: King Abdullah University of Science and Technology, Thuwal (SA)

(72) Inventors: Muhammad M. Hussain, Thuwal (SA); Salman Bin Inayat, Thuwal (SA); Casey Eben Smith, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 147 days.

(21) Appl. No.: 13/762,759

(22) Filed: Feb. 8, 2013

(65) Prior Publication Data

US 2013/0199592 A1    Aug. 8, 2013

Related U.S. Application Data

(60) Provisional application No. 61/596,505, filed on Feb. 8, 2012.

(51) Int. Cl.
*H01L 35/32* (2006.01)
*H01L 35/20* (2006.01)
*H01L 35/16* (2006.01)

(52) U.S. Cl.
CPC ............. *H01L 35/32* (2013.01); *H01L 35/16* (2013.01); *H01L 35/20* (2013.01)

(58) Field of Classification Search
CPC ...................................................... H01L 35/32
USPC ................. 136/205, 206, 208, 226, 236.1
See application file for complete search history.

(56) References Cited

U.S. PATENT DOCUMENTS

| 6,274,803 | B1 | 8/2001 | Yoshioka et al. | 136/201 |
| 6,559,538 | B1 | 5/2003 | Pomerene et al. | 257/712 |
| 8,378,206 | B2 * | 2/2013 | Schuette et al. | 136/205 |

(Continued)

FOREIGN PATENT DOCUMENTS

| EP | 1840980 | 10/2007 |
| WO | WO 2008/142317 | 11/2008 |
| WO | WO 2010/010520 | 1/2010 |

OTHER PUBLICATIONS

International Preliminary Report on Patentability issued in PCT Application No. PCT/US2011/044881, mailed Jan. 23, 2013.

(Continued)

*Primary Examiner* — Susan D Leong
(74) *Attorney, Agent, or Firm* — Norton Rose Fulbright US LLP (57) ABSTRACT

An apparatus and a system for embedded thermoelectric generators are disclosed. In one embodiment, the apparatus is embedded in an interface where the ambient temperatures on two sides of the interface are different. In one embodiment, the apparatus is fabricated with the interface in integrity as a unitary piece. In one embodiment, the apparatus includes a first thermoelectric material embedded through the interface. The apparatus further includes a second thermoelectric material embedded through the interface. The first thermoelectric material is electrically coupled to the second thermoelectric material. In one embodiment, the apparatus further includes an output structure coupled to the first thermoelectric material and the second thermoelectric material and configured to output a voltage.

18 Claims, 7 Drawing Sheets

(56) References Cited

U.S. PATENT DOCUMENTS

| | | | | |
|---|---|---|---|---|
| 2002/0179135 A1* | 12/2002 | Shutoh et al. | | 136/200 |
| 2003/0041892 A1 | 3/2003 | Fleurial et al. | | 136/227 |
| 2006/0137732 A1 | 6/2006 | Farahani et al. | | 136/201 |
| 2007/0125412 A1* | 6/2007 | Funahashi | | 136/201 |
| 2010/0144403 A1 | 6/2010 | Morand | | 455/573 |

OTHER PUBLICATIONS

Strasser et al., "Micromachined CMOS thermoelectric generators as on-chip power supply," *Sensors and Actuators*, 114(2-3):362-370, 2004.

* cited by examiner

APPARATUSES AND SYSTEMS FOR EMBEDDED THERMOELECTRIC GENERATORS

CROSS-REFERENCE TO RELATED APPLICATIONS

This application claims priority to U.S. Provisional Patent Application No. 61/596,505, filed Feb. 8, 2012 and entitled, "APPARATUSES AND SYSTEMS FOR EMBEDDED THERMOELECTRIC GENERATORS," the disclosure of which is incorporated herein by reference.

BACKGROUND OF THE INVENTION

1. Field of the Invention

This invention relates to apparatuses and systems for embedded thermoelectric generators, and more particularly relates to generating electricity by utilizing ambient temperature differences.

2. Description of the Related Art

The increasing gap between the consumption and production of energy has resulted in depletion of conventional sources of energy. One such source of energy is oil. In 2005, 28% of the world's oil fields were in decline, and this percentage has already risen to 40% in 2009. According to the International Energy Agency (IEA), the current rate of oil field decline is 6.7% per year which will increase to 8.6% per year.

With this realization of fossil fuel reserves running out, the world has begun to shift focus towards renewable energy sources to meet energy demands. Renewable energy is one that comes from a natural source capable of replenishing itself over a short span of time. These sources being unlimited in reserves, do not have the risk of running out like fossil fuels and have the added advantage of being environment friendly. Commonly, solar energy used by photovoltaic cells, wind energy harvested using wind turbines and geothermal energy using heat and steam from the depth of the earth are all examples of natural renewable energy used for power generation.

Thermoelectric generators have been fabricated to produce small amounts of power in micro-devices and larger scale generators have been used in solar hybrid systems with solar cells to convert the performance impeding heat into usable power. However, the temperature difference between outside and inside temperatures of a building have not been employed for thermoelectric generation because of the blocking interfaces between the two counter environments. Thus, there is a need for thermoelectric generators embedded into interfaces to take advantage of the temperature difference between the ambient temperature on the two sides of an interface.

SUMMARY OF THE INVENTION

An apparatus for generating electricity is disclosed. In one embodiment, apparatus may be embedded in an interface, where the ambient temperatures of two sides of the interface may be different. In one embodiment, the apparatus may be fabricated with the interface integrity as a unitary piece. In one embodiment, the apparatus may include a first thermoelectric material embedded through a first side and a second side of the interface. The apparatus may further include a second thermoelectric material embedded through the first and second sides of the interface and electrically coupled to the first thermoelectric material. In one embodiment, the first thermoelectric material is p-type, and the second thermoelectric material may be n-type.

The first thermoelectric material may be electrically coupled to the second thermoelectric material. A voltage may be output from the first and second thermoelectric materials when the ambient temperatures on the first and second sides of the interface are different. In one embodiment, the apparatus may further include an output structure. The output structure may be coupled to the first thermoelectric material and the second thermoelectric material and configured to output a voltage.

In one embodiment, the first thermoelectric material may include copper. In an alternative embodiment, the first thermoelectric material may include $Bi_2Te_3$ and other stoichiometric variations $Bi_{2-x}Te_{3+x}$. In one embodiment, the second thermoelectric material may include nickel. In an alternative embodiment, the second thermoelectric material may include $Sb_2Te_3$ and other stoichiometric variations of $(Bi_xSb_{1-x})_2Te_3$.

A system to generate electricity is disclosed. In one embodiment, the system may include an interface, a first thermoelectric material and a second thermoelectric material. The ambient temperatures on two sides of the interface may be different. The first thermoelectric material may be embedded through the interface. The second thermoelectric material may also be embedded through the interface. The first thermoelectric material may be electrically coupled to the second thermoelectric material. In one embodiment, at least two surfaces of the first thermoelectric material may be exposed to the ambient. At least two surfaces of the second thermoelectric material may be exposed to the ambient. In one embodiment, the ambient temperatures on the two sides of the interface are different.

In one embodiment, the interface may be a window. In an alternative embodiment, the interface may be a wall. In another embodiment, the interlace may be a door or a roof. One of ordinary skill in the art may recognize other alternatives for the interface.

In one embodiment, the system may further include an output structure. The output structure may be coupled to the first thermoelectric material and the second thermoelectric material and configured to output a voltage.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises" "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 2A:
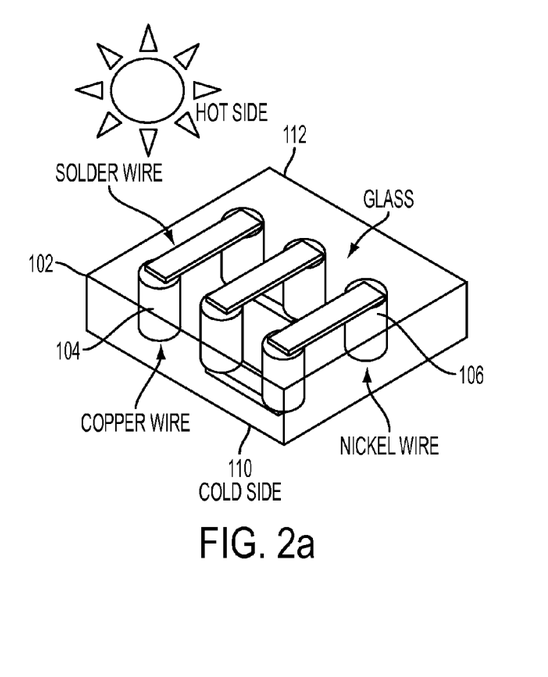
FIG. 2A is a 3D cross-section tilted view of one embodiment of an embedded thermoelectric generator system.
Figure 2B:
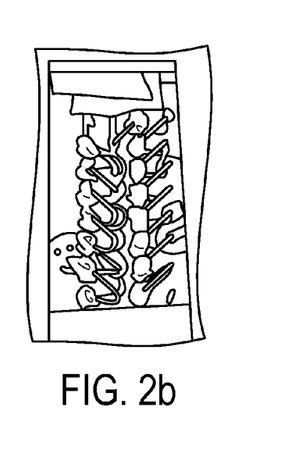
FIG. 2B is a digital photograph showing the glass pieces with copper and nickel wire thermoelectric materials of an embedded thermoelectric generator system.

FIGS. 2A-2B shows a thermoelectric generator system 100 according to one embodiment of the present invention. The system 100 may include an interface 102. In one embodiment, a first thermoelectric material 104 may be embedded through the interface 102. A second thermoelectric material 106 may also be embedded through the interface 102. In one embodiment, the interface 102, the first thermoelectric material 104 and the second thermoelectric material 106 may be fabricated in integrity as a unitary piece. The system 100 may also include a output structure 108.

In one embodiment, the interface 102 for a thermoelectric generator design may be a wall. In an alternative embodiment, the interface 102 may be a window. In another embodiment, the interface 102 may be a door or a roof. One of ordinary skill in the art may recognize other alternatives for the interface 102 for a thermoelectric generator system 100. In one embodiment, the interface 102 may include plastic. In an alternative embodiment, the interface 102 may include glass. In another embodiment, the interface 102 may include concrete. One of ordinary skill in the art may recognize other alternative materials for the interface 102.

In one embodiment, the interface 102 may have a first side 110 and a second side 112. The ambient temperatures on the first side 110 and the ambient temperature on the second side 112 may be different. When the ambient temperatures on the first side 110 and second side 112 are different, the temperature difference may create a electric potential between the first thermoelectric material 104 and the second thermoelectric material 106. Therefore, a voltage may be output from the first thermoelectric material 104 and the second thermoelectric material 106, and electricity may be generated.

In one embodiment, the first thermoelectric material 104 may include one or more columns of thermoelectric wires 114. The second thermoelectric material 106 may also include one or more columns of thermoelectric wires 114. In one embodiment, the first thermoelectric material 104 may be p-type and the second thermoelectric material 106 may be n-type. In one embodiment, the first thermoelectric material 104 may include copper, p-type $Bi_2Te_3$, p-type $Sb_2Te_3$, p-type $AgPh_mSbTe_{2+m}$, p-type poly Si, p-type Si nanowire, p-type PbTe, B, SiGe alloy, Sb, Bi, InGaAs, and/or stoichiometric variations of $(Bi_xSb_{1-x})_2Te_3$. In one embodiment, the second thermoelectric material 106 may include nickel, n-type $Bi_2Te_3$, n-type $AgPb_mSbTe_{2+m}$, n-type $Bi_2Te_{2.83}Se_{0.17}$, n-type SiGe alloy, n-type PbTe, n-type Si nanowire, n-type poly Si, and/or stoichiometric variations of $Bi_{2-x}Te_{3+x}$. One of ordinary skill in the art may recognize other materials for the first thermoelectric material 104 and the second thermoelectric material 106.

In one embodiment, the first thermoelectric material 104 and the second thermoelectric material 106 may be electrically coupled to each other. The first thermoelectric material 104 may be fabricated through the interface 102 such that a first surface of the thermoelectric material 104 may be exposed to the ambient environment on the first side 110 of the interface 102, and a second surface of the thermoelectric material 104 may be exposed to the ambient environment of the second side 112 of the interface 102. In one embodiment, the second thermoelectric material 106 may be fabricated through the interlace 102 such that a first surface of the second thermoelectric material 106 may be exposed to the ambient environment on the first side 110 of the interface 102, and a second surface of the second thermoelectric material 106 may be exposed to the ambient environment of the second side 114 of the interface 102.

In one embodiment, the output structure 108 may be electrically coupled to the first thermoelectric material 104 and the second thermoelectric material 106, and may be configured to output a voltage. In one embodiment, the output structure 108 may be a pair of wire. In such an embodiment, one wire ma be coupled to the first thermoelectric material 104, and the other wire may be coupled to the second thermoelectric material 106.

FIG. 2A shows a 3D cross-section view of one embodiment of a thermoelectric generator system 100, where the interface 102 is a glass window, the first thermoelectric material 104 includes copper wire and the second thermoelectric material 106 includes nickel wire. FIG. 2B shows a digital photograph of one embodiment of the thermoelectric generator system 100 with glass pieces, copper wires and nickel wires.

Theoretical Background

If two dissimilar materials coupled together with the two junctions subjected to different temperatures ($T_H$ and $T_C$) as potential difference ($\Delta V$) is created across the junction proportional to the temperature difference ($\Delta T = T_H - T_C$). The temperature gradient causes the majority carriers to move away from the hot junction towards the cold junction resulting in a net flow of current through the device on application of an appropriate load. The ratio of the generated voltage to the temperature gradient is termed as thermopower or Seebeck coefficient S.

$$S = \Delta V / \Delta T$$

Seebeck coefficient is much larger for semiconductors compared to metals. Performance of thermoelectric materials is evaluated on the basis of unitless figure of merit $$ZT = (\sigma S^2 / k) T$$

where $\sigma$ is the electrical conductivity, S is the Seebeck coefficient and k is the thermal conductivity of the material. For decades, research has been focused at increasing ZT above 1. Electrical conductivity and thermal conductivity are interdependent. Thermal conductivity k is comprised of a lattice component $k_L$ and an electronic component $k_e$. Any attempt to increase the electrical conductivity in order to improve ZT, causes the thermal conductivity to increase as well due to increasing $k_e$. Evolving techniques to reduce $k_L$ while increasing the electrical conductivity simultaneously can result in overall increase in ZT.

The efficiency of a thermoelectric system is a measure of how much heat flux falling the system is transformed into useful output power $P_{out}$, and is dependent upon ZT.

$$\eta = P_{out} / Q.$$

$$\eta = \frac{\Delta T}{T_H} \left[ \frac{\sqrt{1+ZT} - 1}{\sqrt{1+ZT} - \frac{T_C}{T_H}} \right]$$

Where $\eta$ is the efficiency, $T_H$ is the temperature on the hot side and $T_C$ is the temperature on the cold side of the module, while Q is the incident heat flux on the module.

The field of thermoelectric generation had been at stagnation with the figure of merit for various materials, ZT, coming to saturation, as shown in FIG. 1. Efforts to improve the Seebeck coefficient and electrical conductivity without increasing the thermal conductivity had not succeeded to appreciable amounts. With these constraining issues, the efficiency of thermoelectric generators prevents them from being the first choice for mass scale renewable energy option. However, recent advances in fabrication techniques of low dimensional structures like quantum dots and super-lattices, has shown significant improvement in ZT values.

Thermoelectric (TE) systems commonly target at two ends of the energy scale spectrum. At the lower end these systems are fabricated to produce milliwatts of energy to power micro devices using a small temperature gradient of only a few Kelvins. At the higher end of the spectrum, thermoelectric generators are subject to temperature gradients of hundreds of Kelvins, typically in industrial applications or engines to produce kilowatts of energy. The disclosed invention aims at extension of TE systems at lower end of the spectrum (used for micro-devices), to a large coverage area, using abundant and unlimited source of temperature gradient between outside solar and ambient inside, for mass scale energy generation.

The disclosed low temperature thermoelectric system for mass scale energy harvesting overcomes the problems associated with its smaller energy scale counterparts. First, the low temperature gradient produces a very small output voltage in a micro thermoelectric generators (TEG). The low output makes it very difficult to charge up an energy storage device like a battery. To charge up an energy storage like a battery with a micro TEG requires voltage boosters that are not only miniaturized but should also be highly efficient. The disclosed thermoelectric system, spanning a large coverage, will multiply the output voltage manifolds, which may either eliminate the need for charge storage altogether or employ one with less critical requirements.

The other problem that the disclosed low temperature mass scale thermoelectric generator addresses is the load variation, which is further compounded by output fluctuations with changing temperature gradient at such low temperatures. Designing and integrating power conditioning circuitry at micro scale is challenging. The disclosed macro sized mass scale energy harvesters may easily accommodate the use of large sized maximum power point trackers (MPPT) with high efficiency.

Thermoelectric systems have not been employed commonly for mass scale energy generation utilizing the temperature gradients existing between outdoor (environment) and indoor (inside room), due to design limitations. Thermoelectric generators (TEG) can be classified into two broad categories on the basis of their design setup. In lateral design the thermocouples are laid out horizontally and the flow of heat is also lateral through the thermocouples. Alternatively, the vertical setup has the thermocouples standing in a vertical fashion and the flow of heat is from top to bottom or vice versa through the device. The vertically standing thermocouples may also be fabricated laterally and later flipped into a standing position.

Both lateral and vertical designs require the two counter temperature environments to be simultaneously accessible to the hot and cold side of the generator. This requirement strictly eliminates the presence of any interface between the two temperature environments. With these conventional design basics, it is not possible to make use of the phenomenon of thermoelectric generation at various innovative reservoirs of counter temperatures having blocking interfaces in between them. For example, blocking structures like windows and doors make it impossible to generate thermoelectricity using the rich supply of hot outdoor environment and indoor ambient. By placing the thermoelectric generator on the outer side of a window (or vice versa) allows access to the sun heated outside temperature but indoor ambient is prevented altogether from influencing the cold side of the generator because of the intermediate blocking window.

The disclosed invention addresses mass scale energy generation with the novelty of using the interface between outdoor solar heat and indoor ambient, as generator of thermoelectricity by placing the thermoelectric materials through the interface.

Example

Figure 1A:
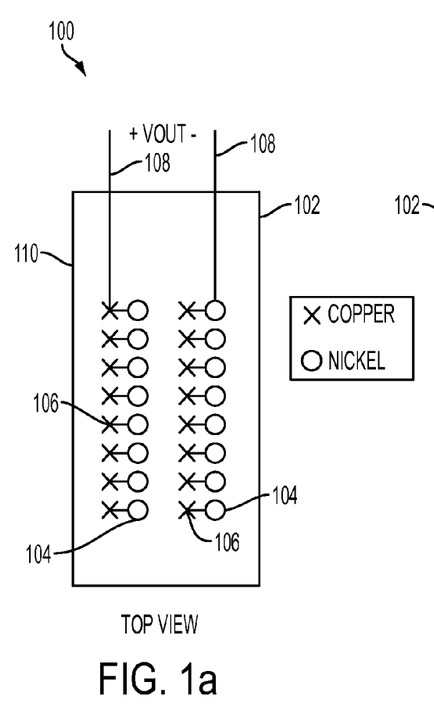
FIG. 1A is a schematic diagram illustrating the top view of one embodiment of an embedded thermoelectric generator system.
Figure 1B:
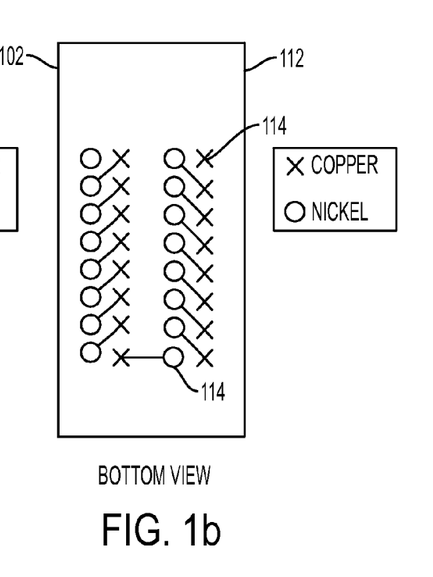
FIG. 1B is a schematic diagram illustrating the bottom view of one embodiment of an embedded thermoelectric generator system.

A transparent plastic slide of thickness 5 mm, was prepared with an array of 32 drilled holes with diameter of 1 mm and spacing distance of 5 mm. Columns of holes were filled alternately with nickel and copper wire constituting the complimentary a type and p type sides of a thermoelectric generator. The diameter of the wire was 1 mm which fitted exactly through the holes. The copper and nickel wires were at least 5 mm long to completely fill the holes drilled through the window. On one side of the slide, the copper wire from one hole was soldered to the nickel wire from the adjacent hole. On the reverse side, the copper wire from one hole was soldered to the nickel wire of the diagonally adjacent hole, as shown in FIGS. 1A-1B.

The internal resistance of the TE plastic slide was measured to be $0.2\Omega$ at room temperature. To measure power generation, the TE plastic slide was placed between a ceramic tile and a heat sink and then placed on a hot plate. Thermal paste was applied between each interface as an attempt to ensure all holes were subject to uniform heat flux. Electrical testing of the slide was carried out for various temperature gradients. The hot plate temperature was ramped up in fine intervals with ample thermal delay to allow the opposite surface of the ceramic tile to attain a stable hot side temperature. The hot side temperature. $T_h$, and cold side temperature, $T_c$, were measured using thermocouples placed on each side of the plastic slide.

Figure 3:
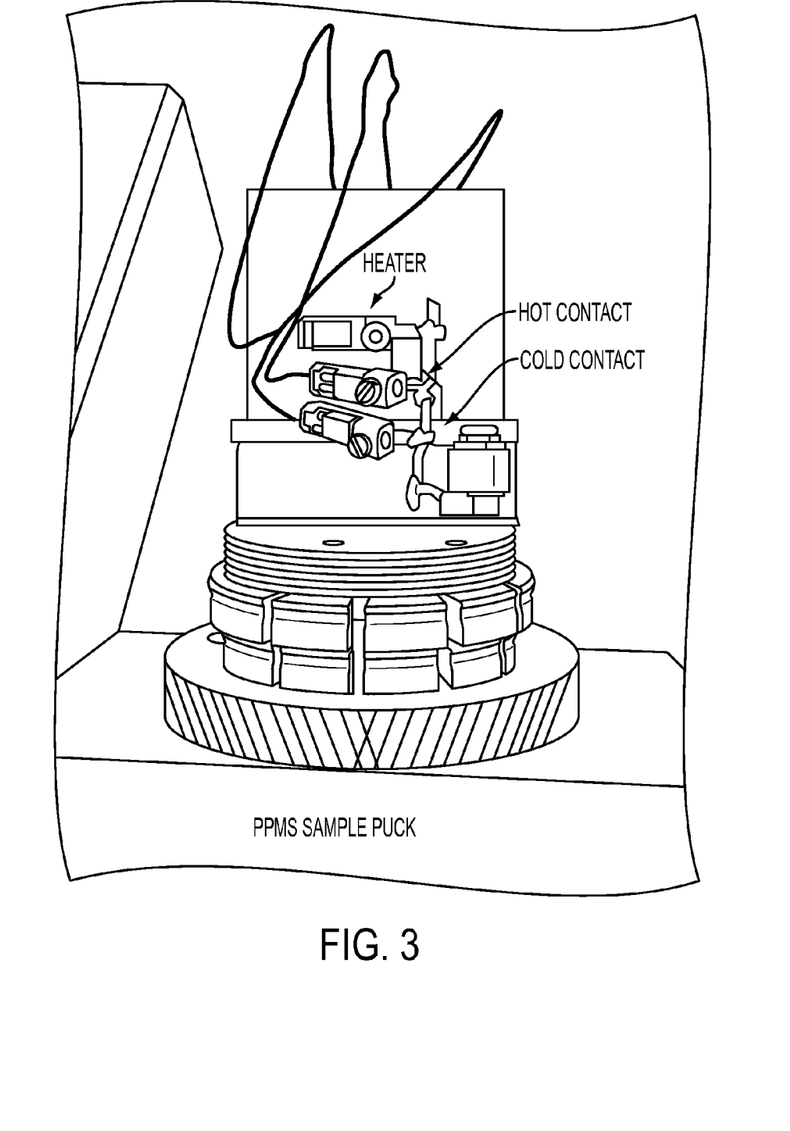
FIG. 3 is a schematic diagram illustrating the nickel wire sample loaded on Physical Properties Measurement System (PPMS) sample puck.
Figure 4A:
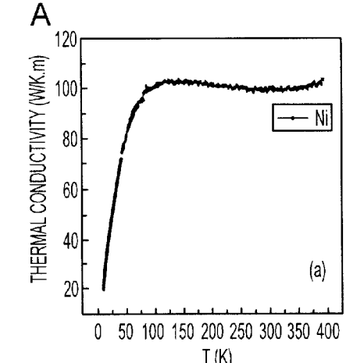
FIGS. 4A-4C are schematic diagrams illustrating the thermoelectric properties of nickel wire measured with PPMS tool: A) thermal conductivity, B) Seebeck coefficient, C) resistivity.
Figure 4B:
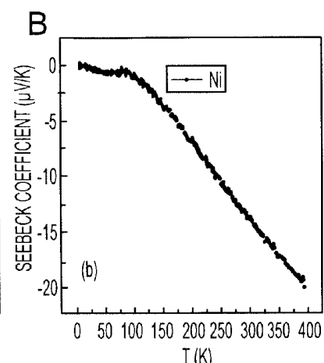
Figure 4C:
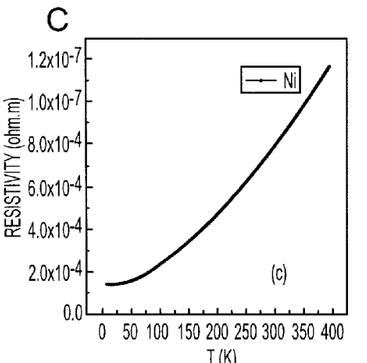
Figure 4D:
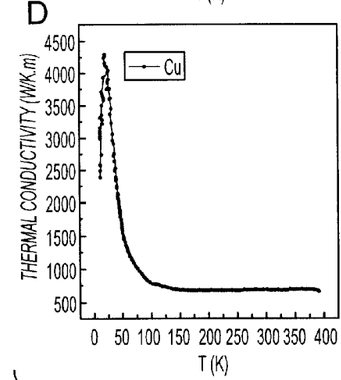
FIGS. 4D-4F are schematic diagrams illustrating the thermoelectric properties of copper wire measured with PPMS tool: D) thermal conductivity, E) Seebeck coefficient, F) resistivity.
Figure 4E:
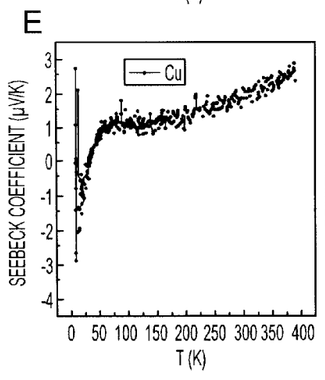
Figure 4F:
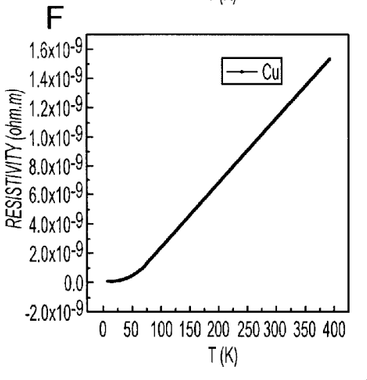

The thermoelectric properties of nickel and copper wire were also characterized independently before integration into the plastic TEG. The Quantum Design™ Physical Properties Measurement System (PPMS) was used for these measurements. Wire samples of 12 mm long were mounted on the sample puck, as shown in FIG. 3. The contacts (heater, T1, T2, cold foot) to the wires were made with a two part epoxy which was cured in a furnace at 150° C. for 5 minutes.

Results and Discussion

The properties of used thermoelectric materials nickel and copper wire measured using the Physical Properties Measurement System (PPMS) (elaborate) tool at are shown in FIGS. 4A-4F. The Seebeck coefficient was −15 μV/K, and 1.7 μV/K for nickel and copper, respectively at 300K. The negative Seebeck coefficient of nickel and the positive Seebeck coefficient of copper verify the n type nature of nickel and p type nature of copper.

Figure 5A:
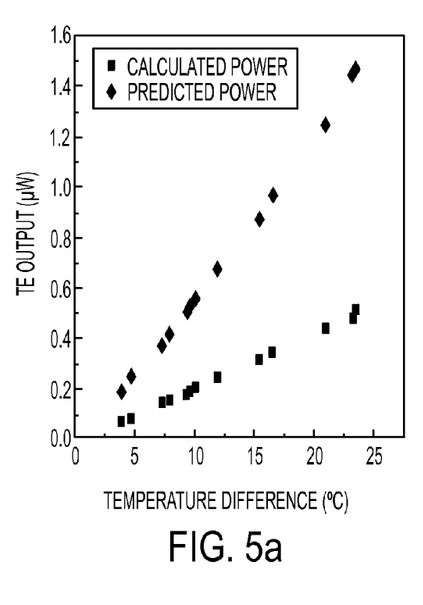
FIGS. 5A-5B are schematic diagrams illustrating comparisons of theoretical and experimental thermoelectric output power and output power density with respect to temperature difference.
Figure 5B:
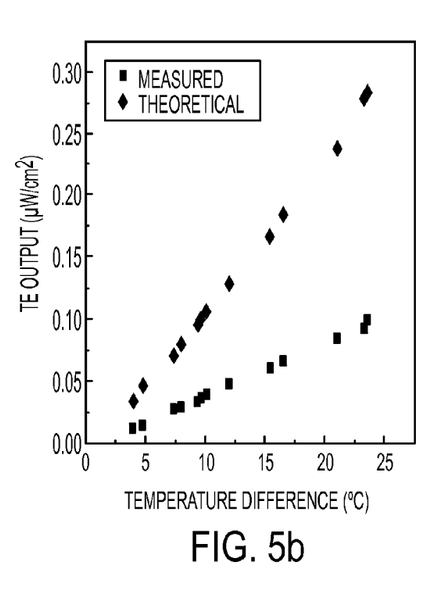

FIGS. 5A-B show the measured and the theoretical output power and output power density, respectively, versus temperature gradient for the TE plastic slide system. The theoretical data was calculated For the temperature gradient of 23.5° C., the output power of the TE plastic slide was 0.1 $\mu W/cm^2$ which is approximately 65% lower than the theoretical value. This difference between the theoretical and experimental results might be due to the non-uniform conduction of heat towards the hot side of thermoelectric materials. The irregular bends in interconnects on the surface of the slide can create an uneven surface profile, thus creating variation in temperature on the hot side of the thermoelectric materials in the holes. Owing to this fact, the temperature gradient across the holes was not same, and therefore, the thermoelectric voltage produced from each hole is not the maximum it is capable of generating. The inactive to active area ratio of the plastic slide was chosen to be 16 for ease of handling the manual interconnects. This high ratio was necessary for routing of the interconnection wires towards the outer sides of the slide, interconnects could not be soldered on the surface of the plastic slide as the soldering temperature would melt the plastic surface, rendering it rough and reducing the uniformity of the holes. By substituting the plastic slide with a glass slide of equal dimensions, it would be possible to solder interconnects without melting the surface of the slide. This will reduce the pitch of the array of holes. Reducing the inactive to active area ratio by half would increase the power per $cm^2$ generated by the TE slide by a factor of four.

Figure 6:
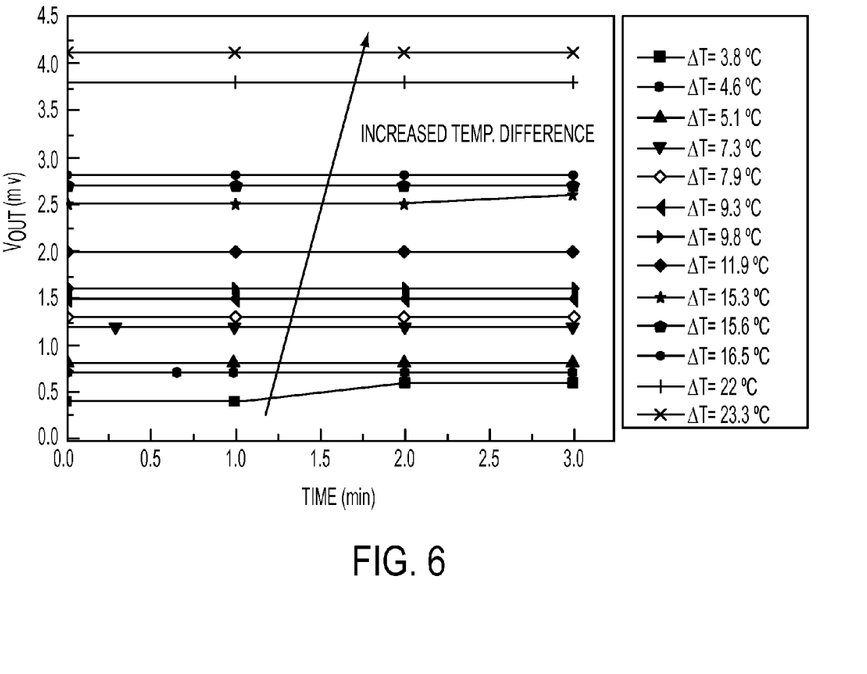
FIG. 6 is a schematic diagram illustrating thermal stability during various temperature differences for copper and nickel wire thermoelectric materials embedded a window.

One of the important parameters is device operation stability over time. FIG. 6 shows the thermal stability measurement plot we extracted from our experiment during various temperature differences. For various temperature differences the output remained reasonably stable over duration of minutes. Nickel and copper being metals (generically with high thermal conductivity) is difficult to maintain a temperature gradient for a very long time. Three to four minutes was the maximum the gradient could be maintained. Alternatively, a glass window (which has low thermal conductivity) can be used with excellent thermoelectric materials like $Bi_2Te_3$, which will maintain thermal stability for longer duration.

Figure 7A:
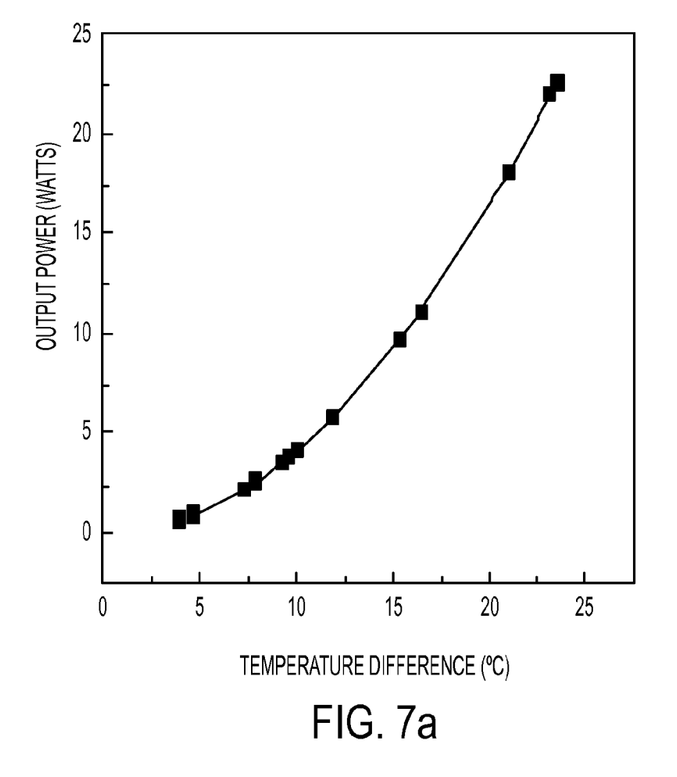
FIGS. 7A-7B are schematic diagrams illustrating calculated output power with respect to temperature difference from a $Bi_2Te_3$ thermoelectric material embedded in a window: A) the hole diameter is 1 mm, B) the hole diameter is 2 mm.
Figure 7B:
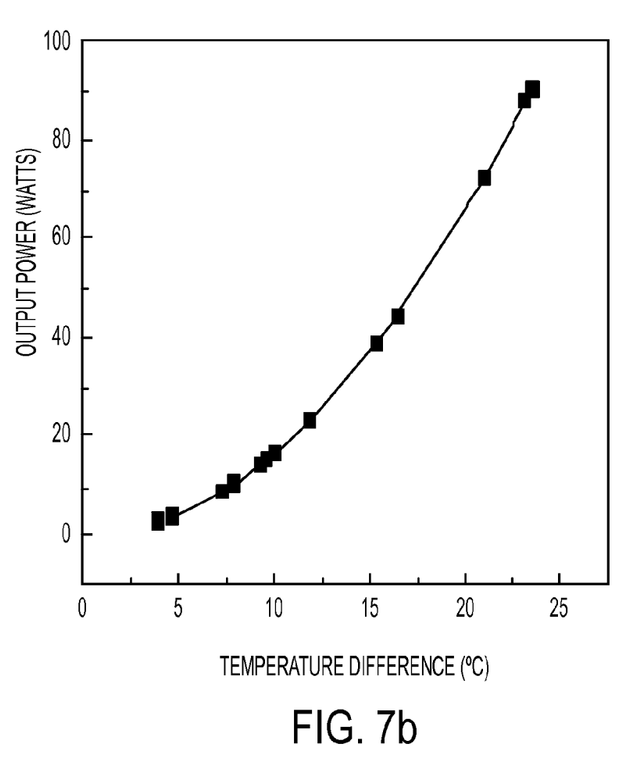

FIG. 7 shows the impact of the size of the holes (to be filled up with thermoelectric materials) on the thermoelectric power generation from a one square meter glass window. The plots in FIG. 7 were based on theoretical values of resistivity of bismuth telluride. Considering a sun-belt region where the average temperature is 45° C. for 6 months in a year, then a 10 feet tall, 10 feet wide glass window room with average inside temperature of 20-22° C. can theoretically generate 900 W power using a $Bi_2Te_3$ embedded glass window system. However, the resistance may be far greater as was in the case for theoretical and experimental nickel and copper. Therefore, the output power for the window may not be as high as derived theoretically. The resistance is inversely proportionate to area and directly proportionate to the number of thermopiles, resistivity of thermoelectric materials and the depth of the hole. By increasing the hole diameter (size), reduction in resistance (as shown in FIG. 7) and thus increment in output power may be expected. Even then with an efficiency of 35%, the thermoelectric generator can produce 315 W of power which can be a useful power source for light emitting, diode based lighting system, charging up cell phones and other appliances.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. An apparatus for generating electricity, the apparatus comprising:
   a first thermoelectric material embedded through a first side and a second side of an interface, the first thermoelectric material having a first end surface disposed in the same plane as the first side and a second end surface disposed in the same plane as the second side, wherein on each of the first and second sides of the interface the first and second end surfaces of the first thermoelectric material are directly exposed to ambient environment; and
   a second thermoelectric material embedded through the first and second sides of the interface and electrically coupled to the first thermoelectric material, the second thermoelectric material having a first end surface disposed in the same plane as the first side and a second end surface disposed in the same plane as the second side, wherein on each of the first and second sides of the interface the first and second end surfaces of the second thermoelectric material are directly exposed to ambient environment;
   wherein a voltage is output from the first and second thermoelectric materials when ambient temperatures on the first and second sides of the interface are different.

2. The apparatus of claim 1, wherein the first thermoelectric material is p-type.

3. The apparatus of claim 1, wherein the second thermoelectric material is n-type.

4. The apparatus of claim 1, being fabricated with the interface into a unitary piece.

5. The apparatus of claim 1, further comprising an output structure coupled to the first thermoelectric material and the second thermoelectric material, the output structure configured to output a voltage.

6. The apparatus of claim 1, wherein the first thermoelectric material comprises copper.

7. The apparatus of claim 1, wherein the first thermoelectric material comprises at least one of the materials selected from p-type $Bi_2Te_3$, p-type poly Si, p-type Si nanowire, p-type PbTe, B, SiGe alloy, Sb, Bi, and InGaAs.

8. The apparatus of claim 1, wherein the second thermoelectric material comprises nickel.

9. The apparatus of claim 1, wherein the second thermoelectric material comprises at last one of the materials selected from n-type $Bi_2Te_3$, n-type $Bi_2Te_{2.83}Se_{0.17}$, n-type SiGe alloy, n-type Si nanowire, and n-type poly Si.

10. A system for generating electricity, the system comprising:
    an interface between a first ambient environment with a first ambient temperature and a second ambient environment with a second ambient temperature;
    a first thermoelectric material embedded through a first side and a second side of the interface, the first thermoelectric material having a first end surface disposed in the same plane as the first side and a second end surface disposed in the same plane as the second side, wherein the first end surface of the first thermoelectric material is directly exposed to the first ambient environment on the first side of the interface and the second end surface of the first thermoelectric material is directly exposed to the second ambient environment on the second side of the interface; and
    a second thermoelectric material embedded through the first and second sides of the interface and electrically coupled to the first thermoelectric material, the second thermoelectric material having a first end surface disposed in the same plane as the first side and a second end surface disposed in the same plane as the second side, wherein the first end surface of the second thermoelectric material is directly exposed to the first ambient environment on the first side of the interface and the second end surface of the second thermoelectric material is directly exposed to the second ambient environment on the second side of the interface;
    wherein a voltage is output from the first and second thermoelectric materials when the first and second ambient temperatures are different.

11. The system of claim 10, wherein the first thermoelectric material is p-type.

12. The system of claim 10, wherein the second thermoelectric material is n-type.

13. The system of claim 10, wherein the interface, the first thermoelectric materials and the second thermoelectric material are fabricated into a unitary piece.

14. The system of claim 10, further comprising an output structure coupled to the first and second thermoelectric materials, the output material configured to output a voltage.

15. The system of claim 10, wherein the first thermoelectric material comprises copper.

16. The system of claim 10, wherein the first thermoelectric material comprises at least one of the materials selected from p-type $Bi_2Te_3$, p-type $Sb_2Te_3$, p-type poly Si, p-type Si nanowire, p-type PbTe, B, SiGe alloy, Sb, Bi, and InGaAs.

17. The system of claim 10, wherein the second thermoelectric material comprises nickel.

18. The system of claim 10, wherein the second thermoelectric material comprises at least one of the materials selected from n-type $Bi_2Te_3$, n-type $Bi_2Te_{2.83}Se_{0.17}$, n-type SiGe alloy, n-type PbTe, n-type Si nanowire, and n-type poly Si.

* * * * *